(12) United States Patent
Kim et al.

(10) Patent No.: US 12,062,737 B2
(45) Date of Patent: Aug. 13, 2024

(54) LED CHIP AND DISPLAY APPARATUS INCLUDING THE SAME

(71) Applicant: SAMSUNG ELECTRONICS CO., LTD., Suwon-si (KR)

(72) Inventors: Sungyeol Kim, Suwon-si (KR); Chunsoon Park, Suwon-si (KR); Kyehoon Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 421 days.

(21) Appl. No.: 17/551,901

(22) Filed: Dec. 15, 2021

(65) Prior Publication Data

US 2022/0199856 A1   Jun. 23, 2022

Related U.S. Application Data

(63) Continuation of application No. PCT/KR2021/018338, filed on Dec. 6, 2021.

(30) Foreign Application Priority Data

Dec. 17, 2020   (KR) .................... 10-2020-0176918

(51) Int. Cl.
*H01L 33/10* (2010.01)
*G02F 1/13357* (2006.01)
(Continued)

(52) U.S. Cl.
CPC ........ *H01L 33/10* (2013.01); *G02F 1/133603* (2013.01); *H01L 25/0753* (2013.01); *H01L 33/486* (2013.01); *H01L 33/56* (2013.01)

(58) Field of Classification Search
CPC . G02F 1/133603; H01L 33/10; H01L 33/486; H01L 25/0753; H02L 33/56
See application file for complete search history.

(56) References Cited

U.S. PATENT DOCUMENTS 6,940,099 B2   9/2005   Hata et al.
8,609,448 B2   12/2013   Chen et al.
(Continued)

FOREIGN PATENT DOCUMENTS

JP   2005-39264 A   2/2005
JP   4928652 B2   5/2012
(Continued)

OTHER PUBLICATIONS

International Search Report (PCT/ISA/210) dated Apr. 6, 2022 issued by the International Searching Authority in International Application No. PCT/KR2021/018338.

*Primary Examiner* — Karabi Guharay
(74) *Attorney, Agent, or Firm* — Sughrue Mion, PLLC

(57) ABSTRACT

A display apparatus is provided. The display apparatus includes a display panel; and a light emitting diode (LED) chip configured to emit light to the display panel. The LED chip includes: a light emitting layer configured to emit light; a semiconductor layer provided on the light emitting layer; and a growth substrate provided on the semiconductor layer. The light emitting layer is arranged to be biased toward a first side of the growth substrate such that a center of an upper surface of the growth substrate is provided between a center of the light emitting layer and a center of the semiconductor layer.

22 Claims, 12 Drawing Sheets

(51) Int. Cl.
*H01L 25/075* (2006.01)
*H01L 33/48* (2010.01)
*H01L 33/56* (2010.01)

(56) References Cited

U.S. PATENT DOCUMENTS

| | | |
|---|---|---|
| 9,252,330 B2 | 2/2016 | Isozaki et al. |
| 9,447,932 B2 | 9/2016 | An et al. |
| 9,876,149 B2 | 1/2018 | Bang et al. |
| 10,655,826 B2 | 5/2020 | Ho et al. |
| 10,804,437 B2 | 10/2020 | Kim et al. |
| 2011/0127549 A1* | 6/2011 | Lee .................. H01L 33/06 |
| | | 257/E33.074 |
| 2018/0226543 A1 | 8/2018 | Masui et al. |

FOREIGN PATENT DOCUMENTS

| | | |
|---|---|---|
| JP | 2018-170318 A | 11/2018 |
| KR | 10-2015-0092801 A | 8/2015 |
| KR | 10-2017-0019551 A | 2/2017 |
| KR | 10-2017-0047664 A | 5/2017 |
| KR | 10-2017-0062434 A | 6/2017 |
| KR | 10-2019-0062395 A | 6/2019 |
| KR | 10-2019-0130997 A | 11/2019 |
| KR | 10-2020-0031249 A | 3/2020 |
| KR | 10-2020-0086488 A | 7/2020 |

* cited by examiner

LED CHIP AND DISPLAY APPARATUS INCLUDING THE SAME

CROSS-REFERENCE TO RELATED APPLICATION(S)

This application is a bypass continuation of PCT International Application No. PCT/KR2021/018338, filed on Dec. 6, 2021, which is based on and claims priority to Korean Patent Application No. 10-2020-0176918, filed on Dec. 17, 2020, in the Korean Intellectual Property Office, the disclosure of which is incorporated by reference herein in its entirety

BACKGROUND

1. Field

The disclosure relates to a light emitting diode (LED) chip having improved light uniformity and structure, and a display apparatus including the same.

2. Description of Related Art

A display apparatus is a type of output device that visually displays data information, such as characters or figures, and images. Examples of, the display apparatus include a television, various monitors, and various portable terminals (for example, laptop computers, tablet PCs, and smart phones).

The display apparatus may be a light-emitting display apparatus, such as an organic light emitting diode (OLED), that uses a display panel that emits light by itself, or a light-receiving display apparatus, such as a liquid crystal display (LCD), that uses a display that does not emit light by itself and needs to receive light from a backlight unit.

According to the position of the light source, the backlight unit may be classified as a direct backlight unit in which the light source is arranged at the rear of the display panel, or an edge backlight unit in which the light source is arranged at the lateral side of the display panel. The direct backlight unit may include a light source plate in which a light emitting diode (LED) is mounted on a flat printed circuit board.

In the display apparatus including the backlight unit, light uniformity of a light source is very important. This is because if the light emitted from the light source is not uniform, the luminance of an image displayed by the display apparatus is not uniform.

SUMMARY

The disclosure provides a light emitting diode (LED) chip having improved light uniformity and structure, and a display apparatus including the same.

The disclosure provides an LED chip in which a center of a light emitting layer coincides with a center of a distributed Bragg reflector (DBR) layer arranged on an upper surface of a substrate, by shifting the light emitting layer to one side of the substrate, and a display apparatus including the same.

The disclosure provides an LED chip in which a center of a light emitting layer coincides with a center of a DBR layer arranged on an upper surface of a substrate by shifting a cutting line of the substrate during the manufacturing of the LED chip, and a display apparatus including the same.

Additional aspects of the disclosure will be set forth in part in the description which follows and, in part, will be apparent from the description, or may be learned by practice of the disclosure.

In accordance with an aspect of the disclosure, a display apparatus includes: a display panel; and a light emitting diode (LED) chip configured to emit light to the display panel. The LED chip includes: a light emitting layer configured to emit light; a semiconductor layer provided on the light emitting layer; and a growth substrate provided on the semiconductor layer. The light emitting layer is arranged to be biased toward a first side of the growth substrate such that a center of an upper surface of the growth substrate is provided between a center of the light emitting layer and a center of the semiconductor layer.

The LED chip may further include a distributed Bragg reflector (DBR) layer provided on an upper surface of the growth substrate.

The growth substrate may include a sapphire substrate.

The display apparatus may further include a printed circuit board, and the LED chip may be provided on a mounting surface of the printed circuit board.

The LED chip may be mounted on the mounting surface by a Chip On Board (COB) method.

A length of a horizontal side of the LED chip and a length of a vertical side of the LED chip may be 500 μm or less, respectively.

The semiconductor layer may be an n-type semiconductor layer, the LED chip may further include a p-type semiconductor layer, and the light emitting layer may be provided between the n-type semiconductor layer and the p-type semiconductor layer.

The LED chip may further include a first distributed Bragg reflector layer (DBR) layer provided on an upper surface of the growth substrate, and a second DBR layer arranged on a lower surface of the light emitting layer.

The LED chip may be configured to emit blue-based light.

The growth substrate may include a first side surface and a second side surface that is substantially parallel to the first side surface, a first angle between the first side surface and the lower surface of the growth substrate may be an acute angle, a second angle between the second side surface and the lower surface of the growth substrate may be an obtuse angle, and the light emitting layer may be shifted in a direction closer to the second side surface.

The first angle and the second angle may be determined by the physical properties of the growth substrate.

The center of the upper surface of the growth substrate and the center of the light emitting layer may be positioned on a straight line perpendicular to the upper surface of the growth substrate and the light emitting layer.

The light emitting layer may be shifted to the first side of the growth substrate by shifting a cutting line that determines the first side surface.

The display apparatus may further include: an optical dome provided on the LED chip.

The optical dome may include silicone or epoxy resin.

In accordance with an aspect of the disclosure, a light emitting diode (LED) chip includes: a light emitting layer configured to emit light: a semiconductor layer provided on the light emitting layer; and a growth substrate provided on the semiconductor layer. The light emitting layer is arranged to be biased toward a first side of the growth substrate such that a center of an upper surface of the growth substrate is provided between a center of the light emitting layer and a center of the semiconductor layer.

In accordance with an aspect of the disclosure, a light emitting diode (LED) chip includes: a light emitting layer; a first semiconductor layer provided on the light emitting layer; and a growth substrate provided on the first semiconductor layer. The growth substrate may include a first sidewall, and a second sidewall that is substantially parallel to the first sidewall and oblique to an upper surface of the growth substrate. A center of the light emitting layer may be closer to the second sidewall than the first sidewall.

The growth substrate may further include a third sidewall, and a fourth sidewall that is substantially parallel to the third sidewall and oblique to the upper surface of the growth substrate, and the center of the light emitting layer may be closer to the fourth sidewall than the third sidewall.

The LED chip may further include a reflector layer provided on the upper surface of the growth substrate, and the center of the light emitting layer and a center of the reflector layer may be aligned with each other provided along a direction perpendicular to the upper surface of the growth substrate.

A first angle between the upper surface of the growth substrate and the first sidewall may be substantially similar to a third angle between the upper surface of the growth substrate and the third sidewall, and a second angle between the upper surface of the growth substrate and the second sidewall may be substantially similar to a fourth angle between the upper surface of the growth substrate and the fourth sidewall.

A sum of the first angle and the second angle may correspond to 180 degrees.

In accordance with an aspect of the disclosure, a display includes: a liquid crystal panel; and a backlight, the backlight including a plurality of light emitting diode (LED) chips, each of which includes: a light emitting layer; a first semiconductor layer provided on the light emitting layer; and a growth substrate provided on the first semiconductor layer, the growth substrate including a first sidewall, and a second sidewall that is substantially parallel to the first sidewall and oblique to an upper surface of the growth substrate, a center of the light emitting layer being closer to the second sidewall than the first sidewall.

BRIEF DESCRIPTION OF THE DRAWINGS

These and/or other aspects of the disclosure will be more apparent from the following description of embodiments, taken in conjunction with the accompanying drawings of which.

DETAILED DESCRIPTION

Figure 1:
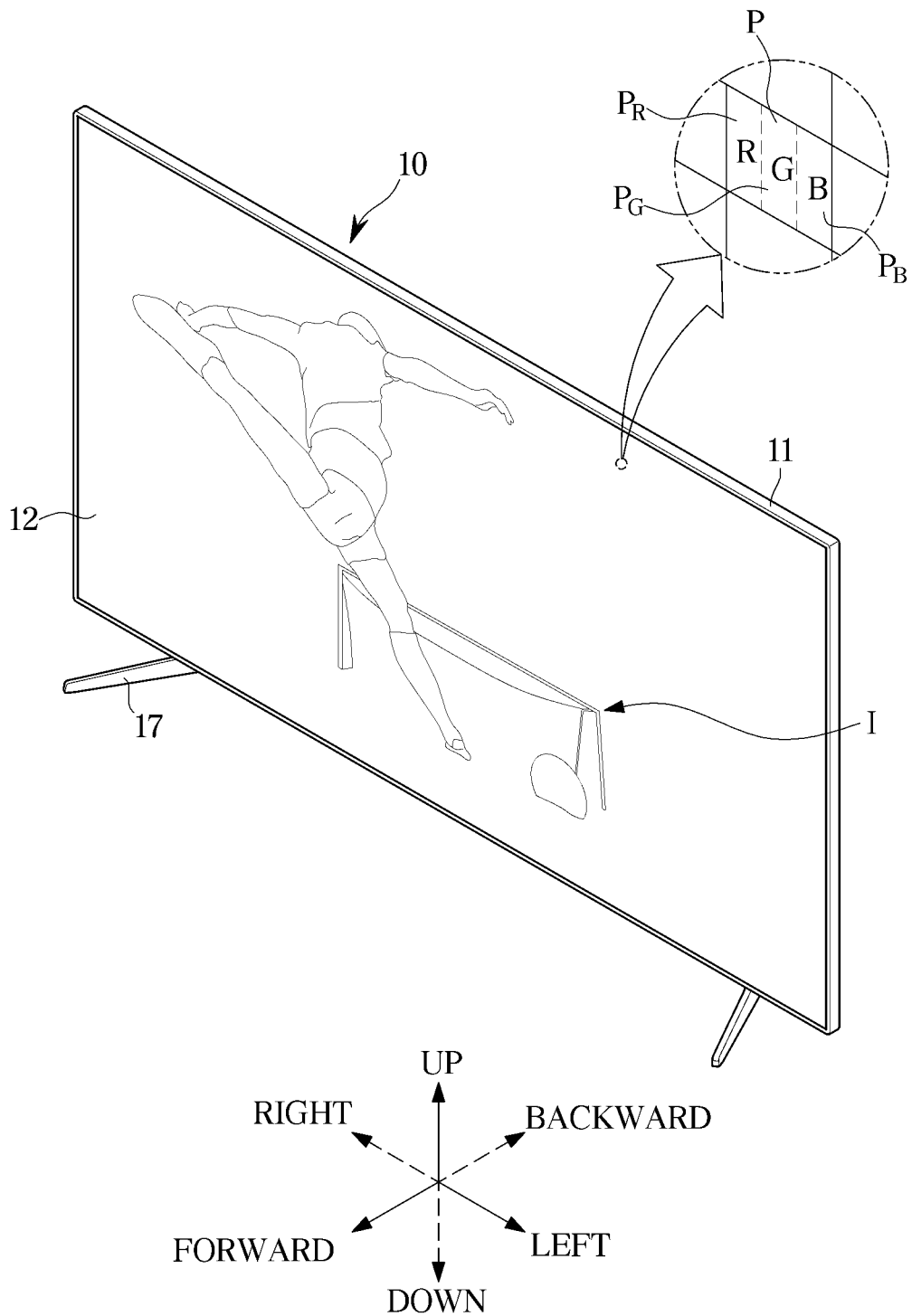
FIG. 1 is a perspective view of a display apparatus according to an embodiment.

Embodiments described in the disclosure and configurations illustrated in the drawings are provided as examples, and may be modified in various ways. Such modified embodiments are within the scope of the disclosure.

The shapes and sizes of elements in the drawings are not necessarily drawn to scale, and may be exaggerated to provide a clear description.

In this disclosure, the terms "including", "having", and the like are used to specify features, numbers, steps, operations, elements, components, or combinations thereof, but do not preclude the presence or addition of one or more of the features, elements, steps, operations, elements, components, or combinations thereof.

As used herein, the terms "1st" or "first" and "2nd" or "second" may use corresponding component regardless of importance or order and are used to distinguish a component from another without limiting the components.

Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

The singular forms "a," "an" and "the" are intended to include the plural forms as well, unless the context clearly indicates otherwise.

Hereinafter, the disclosure will be described more fully with reference to the accompanying drawings.

Figure 2:
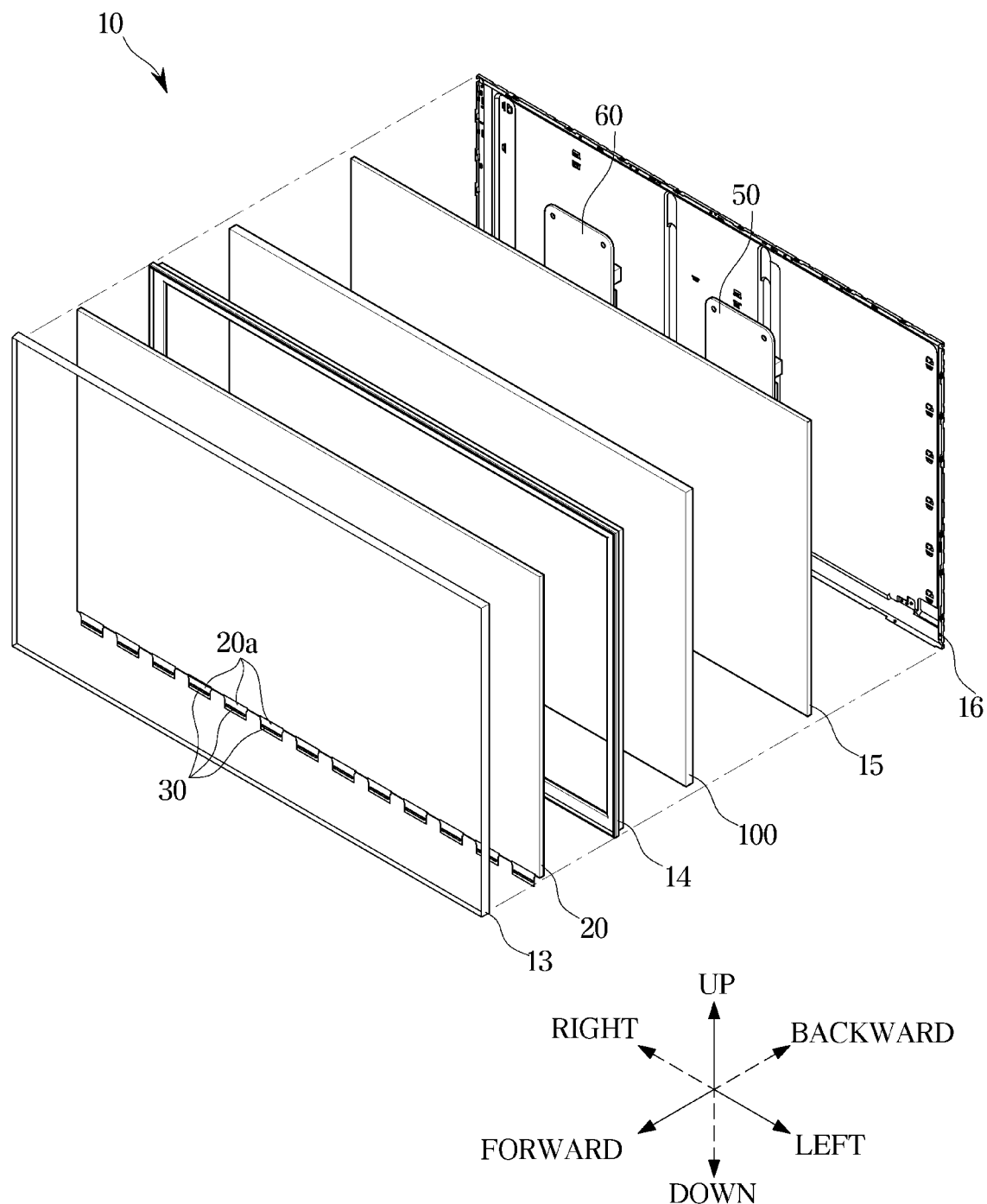
FIG. 2 is an exploded perspective view of a display apparatus according to an embodiment.
Figure 3:
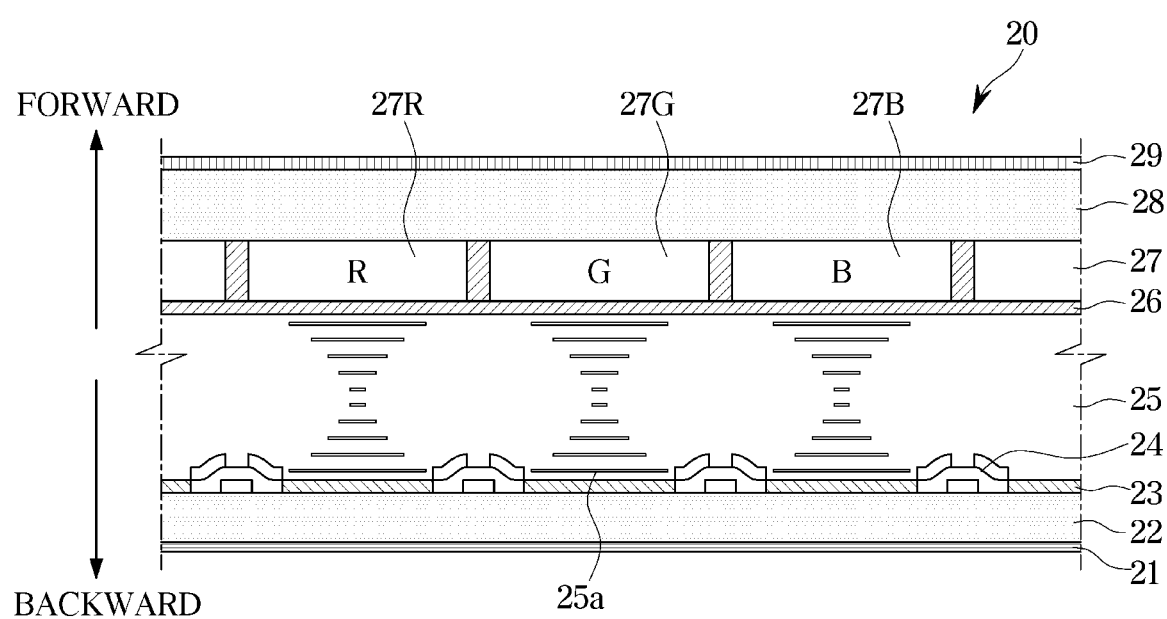
FIG. 3 is a side cross-sectional view of a display panel of a display apparatus according to an embodiment.
Figure 4:
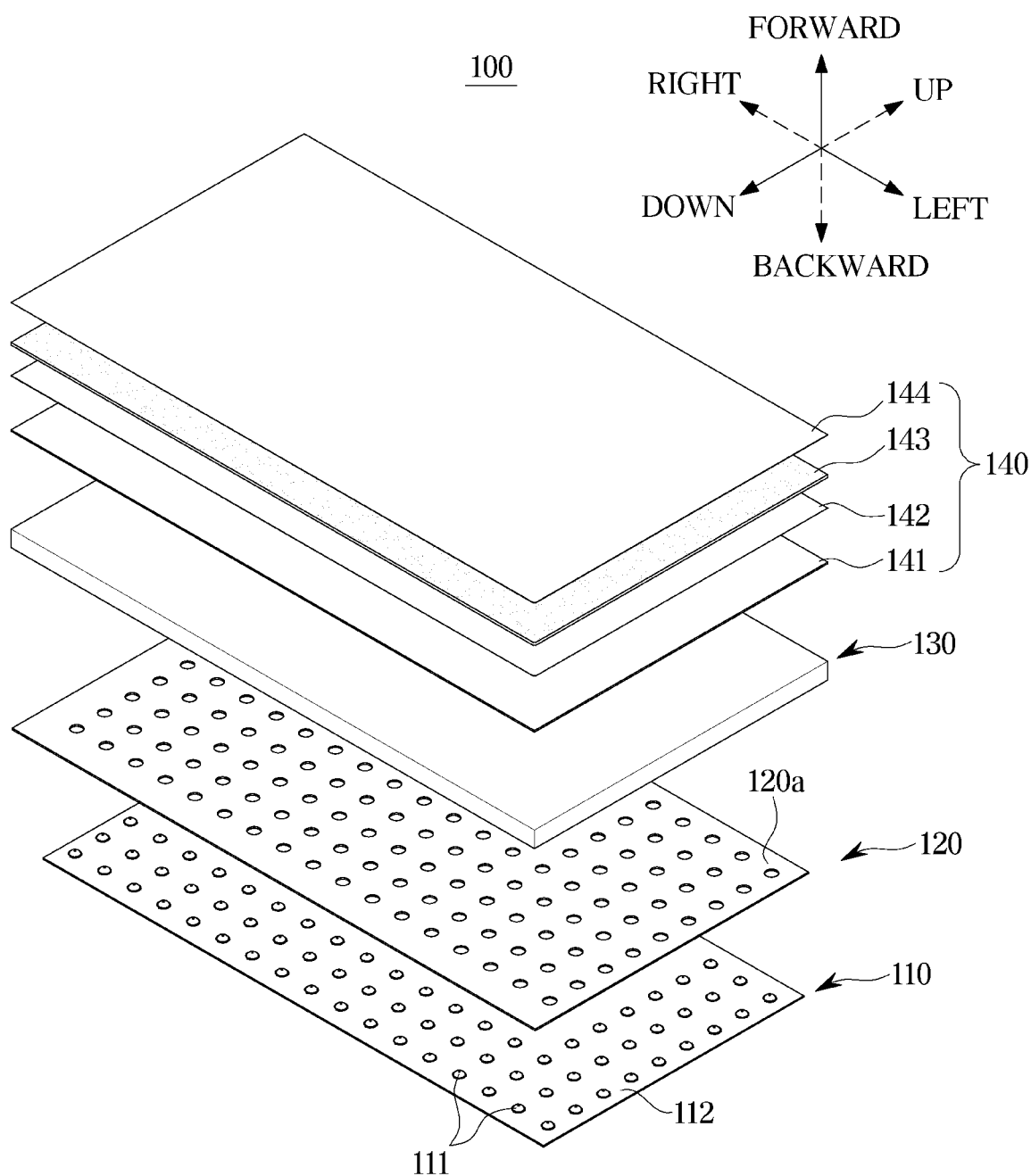
FIG. 4 is an exploded perspective view of a light source device according to an embodiment.

FIG. 1 is a perspective view of a display apparatus according to an embodiment. FIG. 2 is an exploded perspective view of a display apparatus according to an embodiment. FIG. 3 is a side cross-sectional view of a display panel of a display apparatus according to an embodiment. FIG. 4 is an exploded perspective view of a light source device according to an embodiment.

A display apparatus 10 is a device that processes an image signal and visually displays the processed image. Hereinafter, a case in which the display apparatus 10 is a television is exemplified, but the disclosure is not limited thereto. For example, the display apparatus 10 may be implemented in various forms, such as a monitor, a portable multimedia device, and a portable communication device, and a shape of the display apparatus 10 is not limited.

The display apparatus 10 may be a large format display (LFD) installed outdoors, for example as a wall or roof of a building, or as part of a bus stop shelter. The outdoor is not limited to the outside of a building, and thus the display apparatus 10 according to an embodiment may be installed in various places, even indoors, including subway stations, shopping malls, movie theaters, companies, and stores.

The display apparatus 10 may receive content data including video data and audio data from various content sources and output video and audio corresponding to the video data and the audio data. For example, the display apparatus 10 may receive content data through a broadcast reception antenna or cable, from a content playback device, or from a content providing server of a content provider.

As illustrated in FIG. 1, the display apparatus 10 includes a body 11, a screen 12 configured to display an image I, and a support 17 (i.e., a stand) provided below the body 11 to support the body 11.

The body 11 may form an exterior of the display apparatus 10, and the body 11 may include a component configured to allow the display apparatus 10 to display the image I and to perform various functions. Although the body 11 illustrated in FIG. 1 is in the form of a flat plate, the shape of the body 11 is not limited thereto. For example, the body 11 may have a curved plate shape.

The screen 12 may be formed on a front surface of the body 11, and display the image I. For example, the screen 12 may display a still image or a moving image. Further, the screen 12 may display a two-dimensional plane image or a three-dimensional image using binocular parallax of the user.

A plurality of pixels P may be formed on the screen 12 and the image I displayed on the screen 12 may be formed by a combination of the lights emitted from the plurality of pixels P. For example, an image I may be formed on the screen 12 by combining light emitted from the plurality of pixels P as a mosaic.

Each of the plurality of pixels P may emit different brightness and different color of light. Each of the plurality of pixels P may include a self-emission panel (for example, a light emitting diode panel) configured to directly emit light or a non-self-emission panel (for example, a liquid crystal panel) configured to transmit or block light emitted by a light source device.

In order to emit light in the various colors, the plurality of pixels P may include subpixels $P_R$, $P_G$, and $P_B$, respectively.

The subpixels $P_R$, $P_G$, and $P_B$ may include a red subpixel $P_R$ to emit red light, a green subpixel $P_G$ to emit green light, and a blue subpixel $P_B$ to emit blue light. For example, the red light may represent a light beam having a wavelength of approximately 620 nm (nanometers, one billionth of a meter) to 750 nm, the green light may represent a light beam having a wavelength of approximately 495 nm to 570 nm, and the blue light may represent a light beam having a wavelength of approximately 450 nm to 495 nm.

By combining the red light of the red subpixel $P_R$, the green light of the green subpixel $P_G$ and the blue light of the blue subpixel $P_B$, each of the plurality of pixels P may emit different brightness and different color of light.

As illustrated in FIG. 2, various components configured to generate an image I may be provided in the display apparatus 10.

For example, the display apparatus 10 includes a light source device 100 that is a surface light source, a display panel 20 configured to block or transmit light emitted from the light source device 100, a controller configured to control an operation of the light source device 100 and the display panel 20, and a power assembly configured to supply power to the light source device 100 and the display panel 20. Further, the display apparatus 10 includes a bezel 13, a frame middle mold 14, a bottom chassis 15 and a rear cover 16 which may form the body 11, and are provided to support and fix the display panel 20, the light source device 100, the controller and the power assembly.

The light source device 100 may include a point light source configured to emit monochromatic light or white light. The light source device 100 may refract, reflect, and scatter light in order to convert light, which is emitted from the point light source, into uniform surface light. For example, the light source device 100 may include a plurality of light sources configured to emit monochromatic light or white light, a diffuser plate configured to diffuse light incident from the plurality of light sources, a reflective sheet configured to reflect light emitted from the plurality of light sources and a rear surface of the diffuser plate, and an optical sheet configured to refract and scatter light emitted from the front surface of the diffuser plate.

As mentioned above, the light source device 100 may refract, reflect, and scatter light emitted from the light source, thereby emitting uniform surface light toward the front.

A configuration of the light source device 100 will be described in more detail below.

The display panel 20 is provided in front of the light source device 100 and blocks or transmits light emitted from the light source device 100 to form the image I.

A front surface of the display panel 20 may form the screen 12 of the display apparatus 10 described above, and the display panel 20 may form the plurality of pixels P. In the display panel 20, the plurality of pixels P may independently block or transmit light from the light source device 100, and the light transmitted through the plurality of pixels P may form the image I displayed on the screen 12.

For example, as illustrated in FIG. 3, the display panel 20 may include a first polarizing film 21, a first transparent substrate 22, a pixel electrode 23, a thin film transistor 24, a liquid crystal layer 25, a common electrode 26, a color filter 27, a second transparent substrate 28, and a second polarizing film 29.

The first transparent substrate 22 and the second transparent substrate 28 may fixedly support the pixel electrode 23, the thin film transistor 24, the liquid crystal layer 25, the common electrode 26, and the color filter 27. The first and second transparent substrates 22 and 28 may be formed of tempered glass or transparent resin.

The first polarizing film 21 and the second polarizing film 29 are provided on the outside of the first and second transparent substrates 22 and 28.

Each of the first polarizing film 21 and the second polarizing film 29 may transmit a specific light beam and block other light beams. For example, the first polarizing film 21 transmits a light beam having a magnetic field vibrating in a first direction and blocks other light beams. In addition, the second polarizing film 29 transmits a light beam having a magnetic field vibrating in a second direction and blocks other light beams. In this case, the first direction and the second direction may be perpendicular to each other. Accordingly, a polarization direction of the light transmitted through the first polarizing film 21 and a vibration direction of the light transmitted through the second polarizing film 29 are perpendicular to each other. As a result, in general, light may not pass through the first polarizing film 21 and the second polarizing film 29 at the same time.

The color filter 27 may be provided inside the second transparent substrate 28.

The color filter 27 may include a red filter 27R transmitting red light, a green filter 27G transmitting green light, and a blue filter 27B transmitting blue light. The red filter 27R, the green filter 27G, and the blue filter 27B may be disposed parallel to each other. A region in which the color filter 27 is formed corresponds to the pixel P described above. A region in which the red filter 27R is formed corresponds to the red subpixel $P_R$, a region in which the green filter 27G is formed corresponds to the green subpixel $P_G$, and a region in which the blue filter 27B is formed corresponds to the blue subpixel $P_B$.

The pixel electrode 23 may be provided inside the first transparent substrate 22, and the common electrode 26 may be provided inside the second transparent substrate 28.

The pixel electrode 23 and the common electrode 26 may be formed of a metal material through which electricity is conducted, and the pixel electrode 23 and the common electrode 26 may generate an electric field to change the arrangement of liquid crystal molecules 115a forming the liquid crystal layer 25.

The pixel electrode 23 and the common electrode 26 may be formed of a transparent material, and may transmit light incident from the outside. For example, the pixel electrode 23 and the common electrode 26 may include indium tin oxide (ITO), indium zinc oxide (IZO), silver (Ag) nano wire, carbon nanotube (CNT), graphene, or poly (3,4-ethylenedioxythiophene) (PEDOT).

The thin film transistor (TFT) 24 is provided inside the second transparent substrate 22.

The TFT 24 may transmit or block a current flowing through the pixel electrode 23. For example, an electric field may be generated or removed between the pixel electrode 23 and the common electrode 26 by controlling the TFT 24 to turn on (closing) or turn off (opening).

The TFT 24 may be formed of poly-silicon, and may be formed by semiconductor processes, such as lithography, deposition, and ion implantation.

The liquid crystal layer 25 is formed between the pixel electrode 23 and the common electrode 26, and the liquid crystal layer 25 is filled with the liquid crystal molecules 25a.

Liquid crystals represent an intermediate state between a solid (crystal) and a liquid. Most of the liquid crystal materials are organic compounds, and the molecular shape is in the shape of an elongated rod, and the arrangement of molecules is in an irregular state in one direction, but may have a regular crystal shape in other directions. As a result, the liquid crystal has both the fluidity of the liquid and the optical anisotropy of the crystal (solid).

In addition, liquid crystals also exhibit optical properties according to changes in an electric field. For example, in the liquid crystal, the direction of the arrangement of molecules forming the liquid crystal may change according to a change in an electric field. When an electric field is generated in the liquid crystal layer 25, the liquid crystal molecules 115a of the liquid crystal layer 25 may be arranged according to the direction of the electric field. When the electric field is not generated in the liquid crystal layer 25, the liquid crystal molecules 115a may be arranged irregularly or arranged along an alignment layer. As a result, the optical properties of the liquid crystal layer 25 may vary depending on the presence or absence of the electric field passing through the liquid crystal layer 25.

A cable configured to transmit image data to the display panel 20, and a display driver integrated circuit (DDI) (i.e., 'driver IC') configured to process digital image data and output an analog image signal are provided at one side of the display panel 20.

The cable may electrically connect the controller and the power assembly to the driver IC, and may also electrically connect the driver IC to the display panel. The cable may include a flexible flat cable or a film cable that is bendable.

The driver IC may receive image data and power from the controller and the power assembly through the cable. The driver IC may transmit the image data and driving current to the display panel 20 through the cable.

In addition, the cable and the driver IC may be integrally implemented as a film cable, a chip on film (COF), or a tape carrier package (TCP). For example, the driver IC may be disposed on the cable. However, the disclosure is not limited thereto, and the driver IC may be disposed on the display panel 20.

The controller may include a control circuit configured to control an operation of the display panel 20 and the light source device 100. The control circuit may process image data received from an external content source, transmit the image data to the display panel 20, and transmit dimming data to the light source device 100.

The power assembly may supply power to the display panel 20 and the light source device 100 to allow the light source device 100 to output surface light and to allow the display panel 20 to block or transmit the light of the light source device 100.

The controller and the power assembly may be implemented as a printed circuit board and various circuits mounted on the printed circuit board. For example, the power circuit may include a capacitor, a coil, a resistance element, a processor, and a power circuit board on which the capacitor, the coil, the resistance element, and the processor are mounted. Further, the control circuit may include a memory, a processor, and a control circuit board on which the memory and the processor are mounted.

Hereinafter, the light source device 100 will be described.

FIG. 4 is an exploded perspective view of a light source device according to an embodiment.

The light source device 100 includes a light source module 110 configured to generate light, a reflective sheet 120 configured to reflect light, a diffuser plate 130 configured to uniformly diffuse light, and an optical sheet 140 configured to improve luminance of light that is emitted.

The light source module 110 may include a plurality of light sources 111 configured to emit light, and a substrate 112 provided to support and fix the plurality of light sources 111.

The plurality of light sources 111 may be arranged in a predetermined pattern to allow light to be emitted with uniform luminance. The plurality of light sources 111 may be arranged in such a way that a distance between one light source and light sources adjacent thereto is the same.

For example, as illustrated in FIG. 4, the plurality of light sources 111 may be arranged in rows and columns. Accordingly, the plurality of light sources may be arranged such that an approximately square is formed by four adjacent light sources. In addition, any one light source may be disposed adjacent to four light sources, and a distance between one light source and four adjacent light sources may be approximately the same.

Alternatively, the plurality of light sources may be disposed in a plurality of rows, and a light source belonging to each row may be disposed at the center of two light sources belonging to an adjacent row. Accordingly, the plurality of light sources may be arranged such that an approximately equilateral triangle is formed by three adjacent light sources. In this case, one light source may be disposed adjacent to six light sources, and a distance between one light source and six adjacent light sources may be approximately the same.

However, the pattern in which the plurality of light sources 111 is disposed is not limited to the pattern described above, and the plurality of light sources 111 may be disposed in various patterns to allow light to be emitted with uniform luminance.

The light source 111 may employ an element configured to emit monochromatic light (light of a specific wavelength, for example, blue light) or white light (for example, light of a mixture of red light, green light, and blue light) in various directions by receiving power. For example, the light source 111 may include a light emitting diode (LED).

The substrate 112 may fix the plurality of light sources 111 to prevent a change in the position of the light source 111. Further, the substrate 112 may supply power, which is for the light source 111 to emit light, to the light source 111.

The substrate 112 may fix the plurality of light sources 111 and may be configured with synthetic resin or tempered glass or a printed circuit board (PCB) on which a conductive power supply line for supplying power to the light source 111 is formed.

The reflective sheet 120 may reflect light emitted from the plurality of light sources 111 forward or in a direction close to the front.

In the reflective sheet 120, a plurality of through holes 120a is formed at positions corresponding to each of the plurality of light sources 111 of the light source module 110. In addition, the light source 111 of the light source module 110 may pass through the through hole 120a and protrude to the front of the reflective sheet 120.

For example, in the process of assembling the reflective sheet 120 and the light source module 110, the plurality of light sources 111 of the light source module 110 is inserted into the through holes 120a formed on the reflective sheet 120. Accordingly, the substrate 112 of the light source module 110 may be located behind the reflective sheet 120, but the plurality of light sources 111 of the light source module 110 may be located in front of the reflective sheet 120.

Accordingly, the plurality of light sources 111 may emit light in front of the reflective sheet 120.

The plurality of light sources 111 may emit light in various directions from the front of the reflective sheet 120. The light may not only be emitted toward the diffuser plate 130 from the light source 111, but also may be emitted toward the reflective sheet 120 from the light source 111. The reflective sheet 120 may reflect light, which is emitted toward the reflective sheet 120, toward the diffuser plate 130.

Light emitted from the light source 111 passes through various objects, such as the diffuser plate 130 and the optical sheet 140. Among incident light beams passing through the diffuser plate 130 and the optical sheet 140, some of the incident light beams are reflected from the surfaces of the diffuser plate 130 and the optical sheet 140. The reflective sheet 120 may reflect light reflected by the diffuser plate 130 and the optical sheet 140.

The diffuser plate 130 may be provided in front of the light source module 110 and the reflective sheet 120, and may evenly distribute the light emitted from the light source 111 of the light source module 110.

As described above, the plurality of light sources 111 is located in various places on the rear surface of the light source device 100. Although the plurality of light sources 111 is disposed at equal intervals on the rear surface of the light source device 100, unevenness in luminance may occur depending on the positions of the plurality of light sources 111.

The diffuser plate 130 may diffuse light emitted from the plurality of light sources 111 within the diffuser plate 130 in order to remove unevenness in luminance caused by the plurality of light sources 111. The diffuser plate 130 may uniformly emit uneven light provided by the plurality of light sources 111 to the front surface.

The optical sheet 140 may include various sheets for improving luminance and uniformity of luminance. For example, the optical sheet 140 may include a diffusion sheet 141, a first prism sheet 142, a second prism sheet 143, and a reflective polarizing sheet 144.

The diffusion sheet 141 diffuses light for uniformity of luminance. The light emitted from the light source 111 may be diffused by the diffuser plate 130 and may be diffused again by the diffusion sheet 141 included in the optical sheet 140.

The first and second prism sheets 142 and 143 may increase luminance by condensing light diffused by the diffusion sheet 141. The first and second prism sheets 142 and 143 include a prism pattern in the shape of a triangular prism, and a plurality of prism patterns is arranged adjacent to each other to form a plurality of strips.

The reflective polarizing sheet 144 is a type of polarizing film and may transmit some of the incident light beams and reflect others for improving the luminance. For example, the reflective polarizing sheet 144 may transmit polarized light in the same direction as a predetermined polarization direction of the reflective polarizing sheet 144, and may reflect polarized light in a direction different from the polarization direction of the reflective polarizing sheet 144. In addition, the light reflected by the reflective polarizing sheet 144 is recycled inside the light source device 100, and thus the luminance of the display apparatus 10 may be improved by the light recycling.

The optical sheet 140 is not limited to the sheet or film illustrated in FIG. 4, and may include more various sheets or films, such as a protective sheet and quantum dot sheet.

Figure 5:
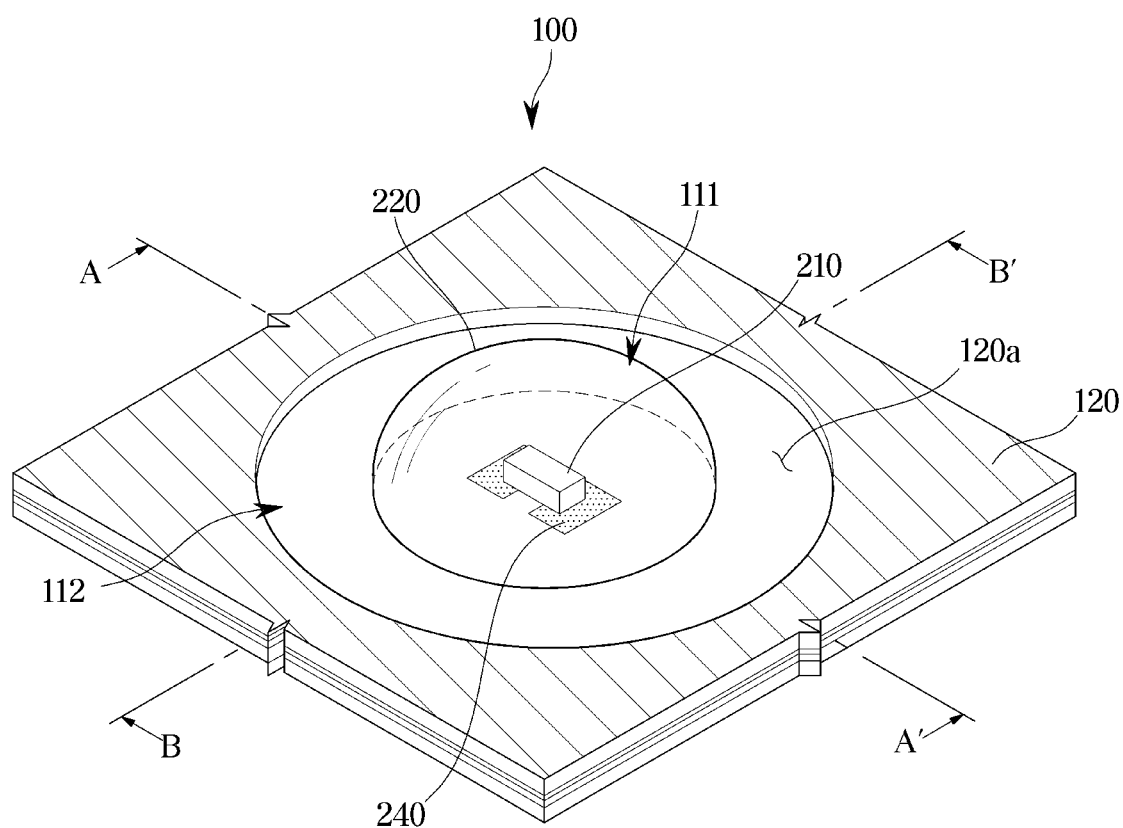
FIG. 5 is an enlarged perspective view of a part of a light source device according to an embodiment.
Figure 6:
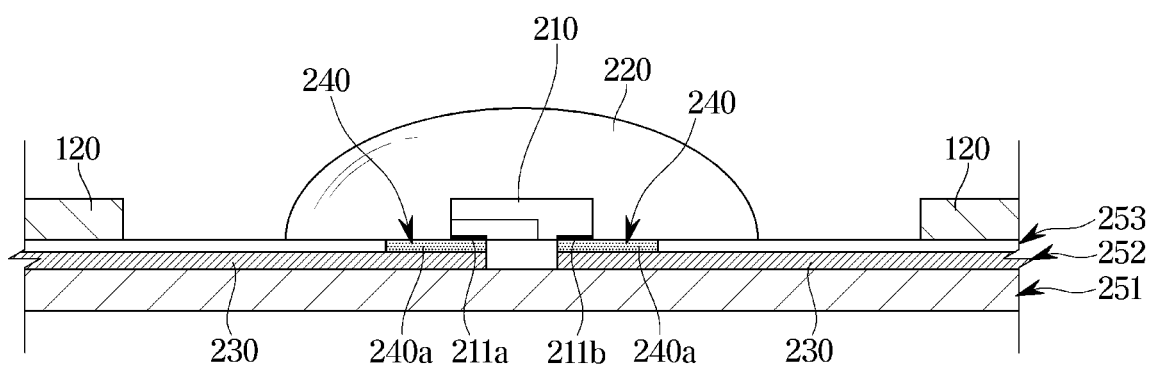
FIG. 6 is a cross-sectional view taken along line A-A' of FIG. 5.

FIG. 5 is an enlarged perspective view of a part of a light source device according to an embodiment. FIG. 6 is a cross-sectional view taken along line A-A' of FIG. 5.

Hereinafter, the light source 111 of the light source device 100 will be described with reference to FIGS. 5 and 6.

As described above, the light source module 110 includes the plurality of light sources 111. The plurality of light sources 111 may protrude forward of the reflective sheet 120 from the rear of the reflective sheet 120 by passing through the through hole 120a. Accordingly, as illustrated in FIGS. 5 and 6, the light source 111 and a part of the substrate 112 may be exposed toward the front of the reflective sheet 120 through the through hole 120a.

The light source 111 may include an electrical/mechanical structure positioned in a region defined by the through hole 120a of the reflective sheet 120.

According to the disclosure, each of the plurality of light sources 111 may include a light emitting diode (LED) chip 210, and an optical dome 220.

In the case of a light source including a lens, the number of light sources may be reduced by widening an optical diffusion region of light emitted from the light source. However, the number of blocks of local dimming is reduced due to a decrease in the number of light sources, which limits improvement of contrast ratio.

According to the disclosure, in order to improve the uniformity of the surface light emitted by the light source 100 and to improve the contrast ratio by local dimming, the light source 100 may not include a lens, and the number of light sources 111 may be increased. Accordingly, a region that may be occupied by each of the plurality of light sources 111 may be narrowed. The optical dome 220 may cover each of the plurality of light sources 111 while having a smaller size compared to the lens.

Figure 7:
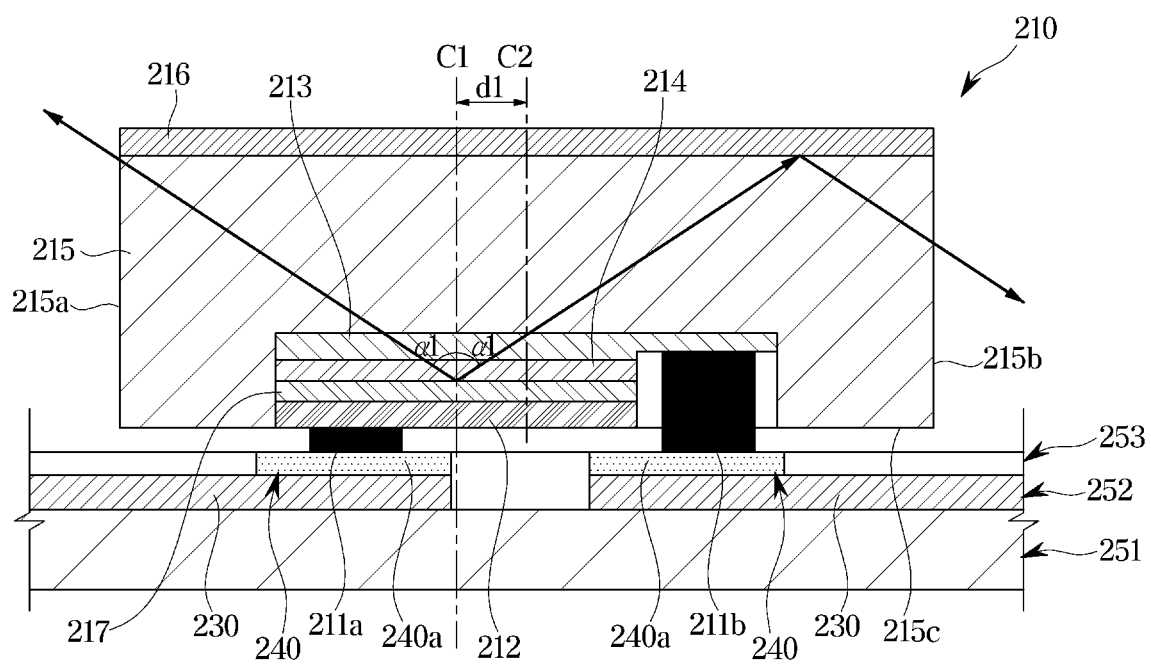
FIG. 7 is an enlarged view of a light emitting diode (LED) chip, illustrating a state in which the LED chip is ideally manufactured.

FIG. 7 is an enlarged view of a light emitting diode (LED) chip, illustrating a state in which the LED chip is ideally manufactured (e.g., manufactured as designed).

Hereinafter, a structure generated when the LED chip is ideally manufactured will be described in detail with reference to FIG. 7.

The LED chip 210 may include a P-type semiconductor layer 213 and an N-type semiconductor layer 212 for emitting light by recombination of holes and electrons. In addition, the LED chip 210 is provided with a pair of electrodes 211a and 211b for supplying holes and electrons to the P-type semiconductor layer 213 and the N-type semiconductor layer 212, respectively.

According to the disclosure, the LED chip 210 may include a growth substrate 215, the p-type semiconductor layer 213, the n-type semiconductor layer 212, and a light emitting layer 214. In addition, the LED chip 210 may further include a first distributed Bragg reflector (DBR) layer 216 and a second DBR layer 217.

The growth substrate 215 may be a sapphire substrate useful as a substrate for nitride semiconductor growth. However, the disclosure is not limited thereto, and may be various substrates, such as a silicon substrate or a GaN substrate, provided for semiconductor single crystal growth. According to an embodiment, the growth substrate 215 may be a sapphire substrate.

The p-type semiconductor layer 213, the n-type semiconductor layer 212, and the light emitting layer 214 may be formed of a nitride semiconductor. The light emitting layer 214 may emit light corresponding to the bandgap energy size by recombination of electrons and holes.

The pair of electrodes 211a and 211b may include an n-type device electrode 211a and a p-type device electrode 211b. The n-type device electrode 211a and the p-type device electrode 211b may be formed of a material capable of ohmic contact with the nitride semiconductor, and thus the n-type device electrode 211a and the p-type device electrode 211b may be formed of a metal such as silver (Ag) or aluminum (Al).

Figure 8:
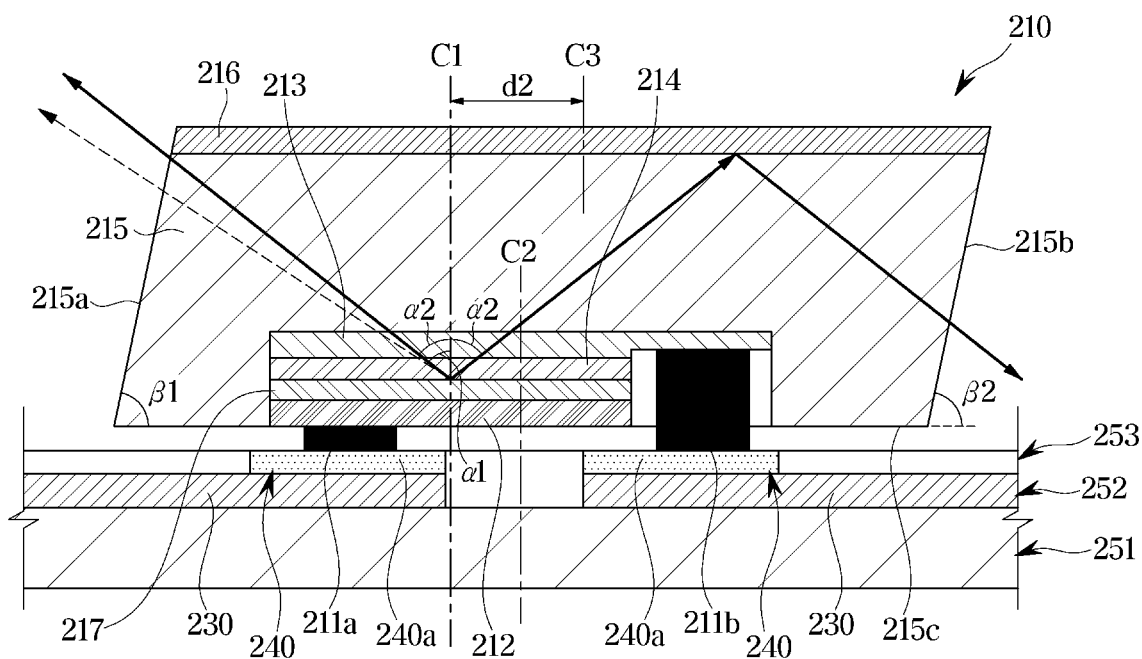
FIG. 8 is a view illustrating an actual state of the LED chip illustrated in FIG. 7.

The positions of the p-type semiconductor layer 213 and the n-type semiconductor layer 212 may be interchanged to be in positions different from those illustrated in FIGS. 7 and 8. In this case, the positions of the n-type device electrode 211a and the p-type device electrode 211b may also be changed.

The first DBR layer 216 and the second DBR layer 217 may be formed by stacking two materials having a difference in refractive index. The first DBR layer 216 and the second DBR layer 217 may reflect light of a target wavelength.

The first DBR layer 216 may be provided on an upper surface of the growth substrate 215. The first DBR layer 216 may reflect some of the light beams emitted from the light emitting layer 214 to increase a light orientation angle with respect to the display panel 20.

The second DBR layer 217 may be provided on a lower surface of the light emitting layer 214. Like the first DBR layer 216, the second DBR layer 217 may reflect some of the light beams emitted from the light emitting layer 214 to increase the light orientation angle with respect to the display panel 20.

According to the disclosure, the DBR layer may be provided on the upper surface of the growth substrate 215, and the DBR layer may be provided on the lower surface of the light emitting layer 214. Particularly, the first DBR layer 216 may be provided on the upper surface of the growth substrate 215, and the second DBR layer 217 may be provided on the lower surface of the light emitting layer 214. In the LED chip 210 according to the disclosure, the pair of DBR layers may be provided on both side surfaces of the light emitting layer 214.

The LED chip 210 may convert electrical energy into optical energy. For example, the LED chip 210 may emit light having a maximum intensity at a predetermined wavelength when power is supplied. For example, the LED chip 210 may emit blue light having a peak value at a wavelength indicating blue (for example, a wavelength between 430 nm and 495 nm).

The LED chip 210 may be directly attached to the substrate 112 in a Chip On Board (COB) method. For example, the light source 111 may include the LED chip 210 to which a light emitting diode chip or a light emitting diode die is directly attached to the substrate 112 without an additional packaging.

In the LED chip 210, a length of a horizontal side and a length of a vertical side of the first DBR layer 216 may be several hundreds of µm. For example, a length of a horizontal side and a length of a vertical side of the upper surface of the growth substrate 215 may be several hundreds of µm. For example, the length of the horizontal side and the length of the vertical side of the upper surface of the growth substrate 215 may be provided to be 500 µm or less, respectively.

In order to reduce the region occupied by the LED chip 210, the LED chip 210 may be manufactured as a flip chip type that does not include a Zener diode. As for the flip chip type LED chip 210, when attaching a light emitting diode, which is a semiconductor device, to the substrate 112, the electrode pattern of the semiconductor device may be fused to the substrate 112 without using an intermediate medium such as a metal lead (wire) or a ball grid array (BGA).

Accordingly, because the metal lead (wire) or the ball grid array is omitted, it is possible to reduce the size of the light source 111 including the flip chip type LED chip 210.

In order to reduce the size of the light source 111, the light source module 110, in which the flip-chip type LED chip 210 is attached to the substrate 112 in a chip-on-board method, may be manufactured.

On the substrate 112, a power supply line 230 and a power supply pad 240 for supplying power to the flip-chip type LED chip 210 are provided.

On the substrate 112, the power supply line 230 for supplying electrical signals and/or power to the LED chip 210 from the controller and/or the power assembly is provided.

As illustrated in FIG. 7, the substrate 112 may be formed by alternately stacking an insulation layer 251 that is non-conductive and a conduction layer 252 that is conductive.

A line or pattern, through which power and/or electrical signals pass, is formed on the conduction layer 252. The conduction layer 252 may be formed of various materials having electrical conductivity. For example, the conduction layer 252 may be formed of various metal materials, such as copper (Cu), tin (Sn), aluminum (Al), or an alloy thereof.

A dielectric of the insulation layer 251 may insulate between lines or patterns of the conduction layer 252. The insulation layer 251 may be formed of a dielectric for electrical insulation, for example, FR-4.

The power supply line 230 may be implemented by a line or pattern formed on the conduction layer 252.

The power supply line 230 may be electrically connected to the LED chip 210 through the power supply pad 240.

The power supply pad 240 may be formed in such a way that the power supply line 230 is exposed to the outside.

A protection layer 253 configured to prevent or suppress damages caused by an external impact and/or damages caused by a chemical action (for example, corrosion, etc.) and/or damages caused by an optical action may be formed in the outermost part of the substrate 112. The protection layer 253 may include a photo solder resist (PSR).

As illustrated in FIG. 7, the protection layer 253 may cover the power supply line 230 to prevent the power supply line 230 from being exposed to the outside.

For electrical contact between the power supply line 230 and the LED chip 210, a window may be formed in the protection layer 253 to expose a part of the power supply line 230 to the outside. A part of the power supply line 230 exposed to the outside through the window of the protection layer 253 may form the power supply pad 240.

A conductive adhesive material 240a for the electrical contact between the power supply line 230 exposed to the outside and the electrode 210a of the LED chip 210 is applied to the power supply pad 240. The conductive adhesive material 240a may be applied within the window of the protection layer 253.

Each of the electrodes 211a and 211b of the LED chip 210 in contact with the conductive adhesive material 240a, and the LED chip 210 may be electrically connected to the power supply line 230 through the conductive adhesive material 240a.

The conductive adhesive material 240a may include a solder having electrical conductivity. However, the disclosure is not limited thereto, and the conductive adhesive material 240a may include electrically conductive epoxy adhesives.

Power may be supplied to the LED chip 210 through the power supply line 230 and the power supply pad 240, and in response to the supply of the power, the LED chip 210 may emit light. A pair of power supply pads 240 corresponding to each of the pair of electrodes 211a and 211b provided in the flip chip type LED chip 210 may be provided.

The optical dome 220 may cover the LED chip 210. The optical dome 220 may be a light-transmitting resin layer. The optical dome 220 may prevent or suppress damages to the LED chip 210 caused by an external mechanical action and/or damage to the LED chip 210 caused by to a chemical action. For example, the optical dome 220 may prevent the LED chip 210 from being separated from the substrate 112 by an external impact.

Referring to FIG. 7, when the LED chip 210 is ideally manufactured, the growth substrate 215 of the LED chip 210 has a substantially rectangular parallelepiped shape. For example, both side surfaces of the growth substrate 215 of the LED chip 210 may be provided to be perpendicular to an upper surface of one of the n-type semiconductor layer 212, the p-type semiconductor layer 213, the light emitting layer 214, and the substrate 112. Hereinafter, the side surface, the upper surface, and the lower surface are defined based on each drawing. Both side surfaces of the growth substrate 215 correspond to left and right surfaces of the growth substrate 215 with reference to FIG. 7. Both side surfaces of the growth substrate illustrated in FIG. 7 may correspond the front and rear surfaces of the growth substrate illustrated in FIG. 10 to be described later.

As illustrated in FIG. 7, when the growth substrate 215 is ideally manufactured, both side surfaces of the growth substrate 215 may be provided vertically (i.e., substantially perpendicular to an upper surface of the light emitting layer 214). In this case, a center C1 of the light emitting layer 214 is laterally spaced apart from a center C2 of the growth substrate 215. In FIG. 7, the center C2 of the growth substrate 215 coincides with a center of the p-type semiconductor layer 213. Accordingly, the center C2 of the growth substrate 215 may correspond to a center of the p-type semiconductor layer 213. The center C2 of the growth substrate 215 may correspond to a center of the first DBR layer 216.

Hereinafter, a distance between the center C1 of the light emitting layer 214 and the center C2 of the p-type semiconductor layer 213, the growth substrate 215 or the first DBR layer 216 is referred to as d1. Even if the growth substrate 215 is ideally manufactured, the center C1 of the light emitting layer 214 and the center C2 of the growth substrate 215 are spaced apart by d1, and d1≠0. The reason of d1≠0 is because an area of the upper surface of the light emitting layer 214 is different from an area of the upper surface of the p-type semiconductor layer 213. Due to the difference in area between the light emitting layer 214 and the p-type semiconductor layer 213, the center of the light emitting layer 214 and the center of the p-type semiconductor layer 213 are spaced apart. As described above, the growth substrate 215 may be designed in such a way that the center thereof coincides with the p-type semiconductor layer 213. Accordingly, the center C2 of the growth substrate 215 and the center C1 of the light emitting layer 214 are spaced apart by d1, and d1≠0.

When the center C1 of the light emitting layer 214 and the center C2 of the growth substrate 215 are spaced apart by d1, as described above, light emitted from a point of the light emitting layer 214 may be emitted directly to the outside of the growth substrate 215 without passing through the first DBR layer 216.

Light emitted at an angle of α1 with respect to the normal passing through the center C1 of the light emitting layer 214 will be described as an example of some of the light beams emitted from the center C1 of the light emitting layer 214. Light emitted from the center C1 of the light emitting layer 214 to the left side with reference to FIG. 7 at an angle of α1 with respect to the normal line may pass through the growth substrate 215 and be emitted directly, for example, through a side surface of the growth substrate 215. On the other hand, light emitted from the center C1 of the light emitting layer 214 to the right side with reference to FIG. 7 at an angle of α1 with respect to the normal line may be emitted after being reflected by the first DBR layer 216. Although light emitted from the center C1 of the light emitting layer 214 has been described above as an example, the above content may be applied to all points of the light emitting layer 214. That is, when the center C1 of the light emitting layer 214 and the center C2 of the growth substrate 215 are spaced apart, optical paths of light emitted from one point of the light emitting layer 214 may become different. When the optical paths of the light emitted from the light emitting layer 214 are different, the light uniformity of the LED chip 210 may be reduced. Accordingly, the luminance of the display apparatus may become non-uniform, which deteriorates the marketability of the display apparatus.

FIG. 8 is a view illustrating an actual state of the LED chip illustrated in FIG. 7.

Hereinafter, an actual structure of the LED chip when designed as illustrated in FIG. 7 will be described in detail with reference to FIG. 8.

As illustrated in FIG. 8, in the case of the actual LED chip 210, both side surfaces of the growth substrate 215 may be inclined. Particularly, both side surfaces of the growth substrate 215 of the LED chip 210 may be provided inclined with respect to the upper surface of one of the n-type semiconductor layer 212, the p-type semiconductor layer 213, the light emitting layer 214 and the substrate 112.

According to an embodiment, the growth substrate 215 may be a sapphire substrate. When the growth substrate 215 is a sapphire substrate, a shape of both side surfaces of the growth substrate 215 is determined according to the grain of the sapphire. For example, an angle, at which both side surfaces are inclined with respect to the lower surface, is determined based on the grain of the sapphire.

As illustrated in FIG. 8, both side surfaces of the growth substrate 215 are not perpendicular to the lower surface of the growth substrate 215 due to the physical properties of sapphire. The side surface of the growth substrate 215 may be inclined by a predetermined angle with respect to the lower surface of the growth substrate 215. The predetermined angle may be $\beta 1$ or $\beta 2$, and $\beta 1$ and $\beta 2$ may be the same angle. According to an embodiment, $\beta 1$ and $\beta 2$ may be 83° to 85°.

That is, when the growth substrate 215 is a sapphire substrate, both side surfaces of the growth substrate 215 may not be perpendicular to the lower surface, but both side surfaces may be provided to be inclined with respect to the lower surface according to the grain of the sapphire substrate, and the angle may be approximately 83° to 85°. However, it is not limited to the above angle, and may have an angle of greater than or equal to 85°, but not greater than or equal to 90° as designed.

Referring to FIG. 8, both side surfaces of the growth substrate 215 are provided to be inclined with respect to the lower surface, respectively, due to the physical properties of the sapphire substrate, and thus the center C1 of the light emitting layer 214 and a center C3 of the upper surface of the growth substrate 215 are spaced apart laterally. Hereinafter, the center C3 of the upper surface of the growth substrate 215 may correspond to the center of the first DBR layer 216. The center C3 of the upper surface of the growth substrate 215 corresponds to the center of the growth substrate 215 when both side surfaces of the growth substrate 215 are inclined due to the physical properties of sapphire.

Hereinafter, a distance between the center C1 of the light emitting layer 214 and the center C3 of the upper surface of the actual growth substrate 215 is referred to as d2. When both side surfaces of the growth substrate 215 are inclined due to the physical properties of sapphire, the distance d2 between the center C1 of the light emitting layer 214 and the center C3 of the upper surface of the growth substrate 215 is greater than the distance d1 between the center C1 of the light emitting layer 214 and the center C2 of the p-type semiconductor layer 213. That is, d2>d1 is satisfied.

As the distance between the center C1 of the light emitting layer 214 and the center C3 of the upper surface of the growth substrate 215 increases, the light uniformity of the LED chip 210 may be further reduced, and the luminance of the display apparatus may be more non-uniform.

Light emitted at an angle of $\alpha 2$ with respect to the normal passing through the center C1 of the light emitting layer 214 will be described as an example of some of the light beams emitted from the center C1 of the light emitting layer 214. Light emitted from the center C1 of the light emitting layer 214 to the left side with reference to FIG. 8 at an angle of $\alpha 2$ with respect to the normal line may pass through the growth substrate 215 and be emitted directly. On the other hand, light emitted from the center C1 of the light emitting layer 214 to the right side with reference to FIG. 8 at an angle of $\alpha 2$ with respect to the normal line may be emitted after being reflected by the first DBR layer 216. Although light emitted from the center C1 of the light emitting layer 214 has been described above as an example, the above content may be applied to all points of the light emitting layer 214. That is, when the center C1 of the light emitting layer 214 and the upper surface of the center C3 of the growth substrate 215 are spaced apart, optical paths of light emitted from one point of the light emitting layer 214 may be different. When the optical paths of the light emitted from the light emitting layer 214 are different, the light uniformity of the LED chip 210 may be reduced. Accordingly, the luminance of the display apparatus may become non-uniform, which deteriorates the marketability of the display apparatus.

When distance d2, which is the distance between the center C1 of the light emitting layer 214 and the upper surface of the center C3 of the growth substrate 215, is greater than d1, optical paths of light, which is emitted at an angle of $\alpha 2$ less than $\alpha 1$, with respect to the normal passing through the center C1 of the light emitting layer 214, may become different. For example, a critical angle, at which the optical paths of light emitted from one point of the light emitting layer 214 become different, is further reduced. The critical angle, at which the optical paths are different, is an angle at which light emitted from the center C1 of the light emitting layer 214 is emitted obliquely with respect to the normal passing through the center C1, and corresponds to the minimum angle at which the optical paths become different. When the distance between centers is increased from d1 to d2, the critical angle at which the optical paths become different may be reduced from $\alpha 1$ to $\alpha 2$. Accordingly, an amount of emitted light in which the optical paths become different may be increased, and the light uniformity of the LED chip 210 may be further reduced. Therefore, there is a need to reduce the distance d2 between the center C1 of the light emitting layer 214 and the center C3 of the upper surface of the growth substrate 215.

Figure 9:
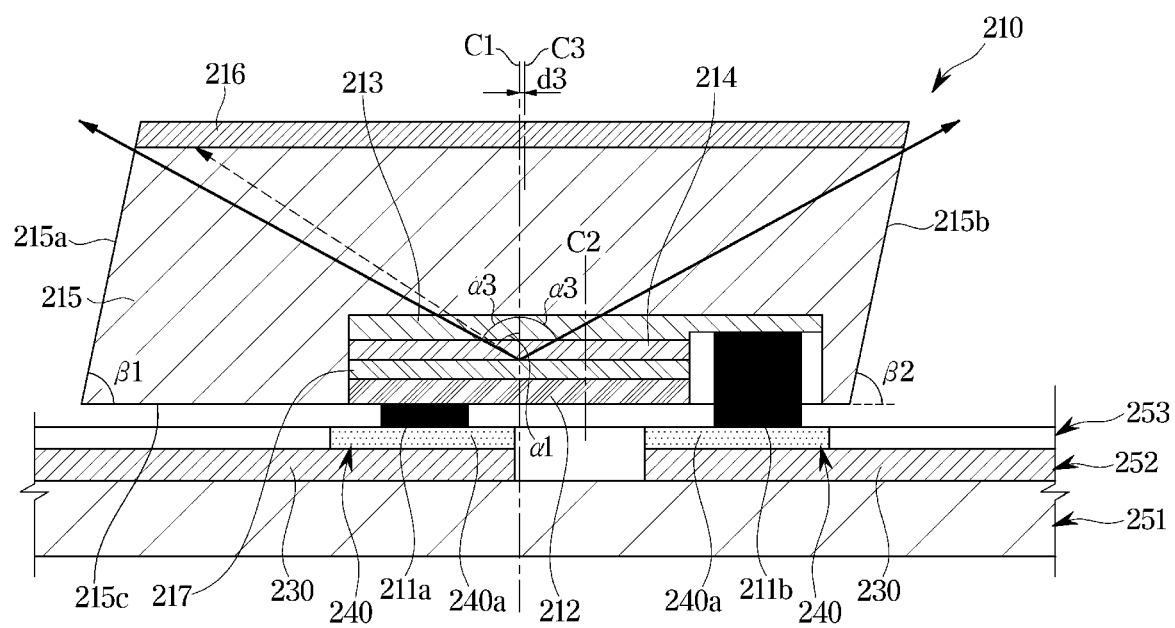
FIG. 9 is a cross-sectional view taken along line A-A' of FIG. 5, particularly an enlarged view of the LED chip according to an embodiment.

FIG. 9 is a cross-sectional view taken along line A-A' of FIG. 5, particularly an enlarged view of an LED chip according to an embodiment.

Hereinafter, the structure of the LED chip according to an embodiment will be described in detail.

As illustrated in FIG. 9, both side surfaces of the growth substrate 215 may be inclined, like the actual structure illustrated in FIG. 8. Hereinafter, in the LED chip 210 according to an embodiment, the center of the upper surface of the growth substrate 215 is referred to as C3. C3 may correspond to the center of the first DBR layer 216. In addition, a distance between the center C1 of the light emitting layer 214 and the center C3 of the upper surface of the growth substrate 215 is referred to as d3.

According to the disclosure, d3≤d1 is satisfied. This is because a center C2 of the p-type semiconductor layer 213 and the center C3 of the upper surface of the growth substrate 215 are separated from each other so as to reduce the distance between the center C1 of the light emitting layer 214 and the center C3 of the upper surface of the growth substrate 215. As described above with respect to FIG. 7, the center C2 of the p-type semiconductor layer 213 positioned in the upper side of the light emitting layer 214 coincides with the center C3 of the upper surface of the growth substrate 215. According to the disclosure, the light emitting layer 214 or the p-type semiconductor layer 213 is shifted (i.e., offset from the center C3 of the upper surface of the growth substrate 215) to prevent the center C2 of the p-type semiconductor layer 213 and the center C3 of the upper surface of the growth substrate 215 from coinciding with each other. Because the p-type semiconductor layer 213 is provided on the upper surface of the light-emitting layer 214, it is possible to shift the p-type semiconductor layer 213 by shifting the light-emitting layer 214. That is, shifting the light emitting layer 214 and shifting the p-type semiconductor layer 213 may have the same meaning.

It is possible to shift the light emitting layer 214 to allow the center C3 of the upper surface of the growth substrate 215 to be positioned between the center C1 of the light emitting layer 214 and the center C2 of the p-type semiconductor layer 213.

As illustrated in FIG. 8, when the center C2 of the p-type semiconductor layer 213 is positioned between the center C1 of the light emitting layer 214 and the center C3 of the upper surface of the growth substrate 215 due to the cutting of the growth substrate 215, it is possible to shift the light emitting layer 214, as described above. For example, when the distance between the center C3 of the upper surface of the growth substrate 215 and the center C1 of the light emitting layer 214 is increased from d1 to d2 due to cutting of the growth substrate 215, it is possible to shift the light emitting layer 214. In this case, the light emitting layer 214 may be shifted in a direction in which the distance between the center C1 of the light emitting layer 214 and the center C3 of the upper surface of the growth substrate 215 is reduced.

The direction, in which the distance between the center C1 of the light emitting layer 214 and the center C3 of the upper surface of the growth substrate 215 is reduced, may be a direction in which the light emitting layer 214 is relatively close to one side surface 215b, in which an included angle with a lower surface 215c of the growth substrate 215 is an obtuse angle, among both side surfaces 215a and 215b of the growth substrate 215. With respect to FIG. 9, the light emitting layer 214 may be shifted to be closer to the one side surface 215b of the growth substrate 215 than to the one side surface 215a of the growth substrate 215. In this case, the included angle between the one side surface 215b of the growth substrate 215 and the lower surface 215c of the growth substrate 215 is an obtuse angle. This is because β2 is an acute angle, as described above.

Hereinafter, when the center C3 of the upper surface of the growth substrate 215 is spaced apart by d3 to the right side with respect to the center C1 of the light emitting layer 214, it is said that the center C3 is spaced apart by +d3. When the center C3 of the upper surface of the growth substrate 215 is spaced apart by d3 to the left side with respect to the center C1 of the light emitting layer 214, it is said that the center C3 is spaced apart by −d3.

According to the disclosure, −d1≤d3≤+d1 is satisfied. As described above, by shifting the light emitting layer 214 with respect to the growth substrate 215, the distance between the center C1 of the light emitting layer 214 and the center C3 of the upper surface of the growth substrate 215 may be reduced.

When the distance d3, which is the distance between the center C1 of the light emitting layer 214 and the center C3 of the upper surface of the growth substrate 215, is less than d1, a critical angle, at which the optical paths of the light emitted from one point of the light emitting layer 214 become different, may be greater than α1. The critical angle, at which the optical paths become different, may be an angle at which light emitted from the center C1 of the light emitting layer 214 is emitted obliquely with respect to the normal passing through the center C1, and the critical angle corresponds to the minimum angle at which the optical paths become different. When the distance between the centers is reduced from d1 to d3, the critical angle at which the optical paths become different may be increased from α1 to α3. FIG. 9 illustrates that the optical paths coincide with each other, but in a state in which d3 is greater than that illustrated in FIG. 9, when the light emitted from the center C1 of the light emitting layer 214 is emitted at α3 with respect to the normal passing through the center C1, the optical paths become different.

As described above, when the critical angle at which the optical paths become different is increased, the amount of emitted light in which the optical paths become different is reduced, and the light uniformity of the LED chip 210 may be improved. Further, the luminance of the display apparatus may be uniform.

In addition, when the center C1 of the light emitting layer 214 and the center C3 of the upper surface of the growth substrate 215 coincide with each other, that is, d3=0, the optical paths of light in various directions emitted from the center C1 of the light emitting layer 214 may coincide with each other. In this case, the light uniformity of the LED chip 210 may be improved to the maximum, and the luminance of the display apparatus may be most uniform.

Figure 10:
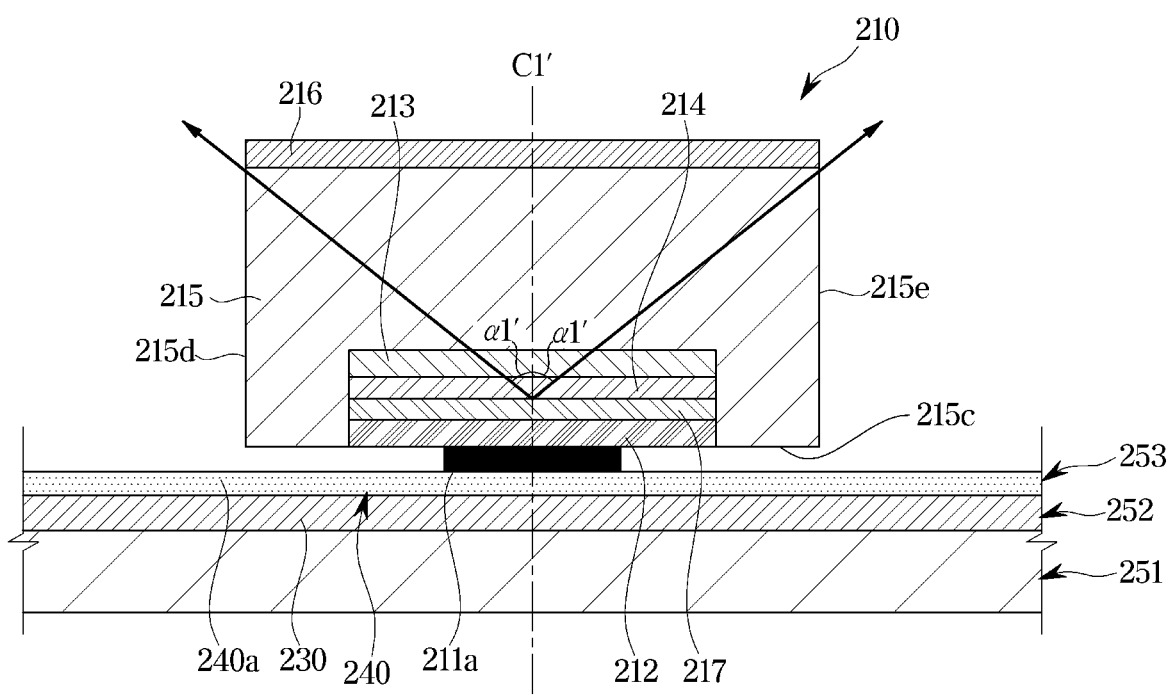
FIG. 10 is a cross-sectional view, illustrating a state in which the LED chip is ideally manufactured.

FIG. 10 is a cross-sectional view, illustrating a state in which the LED chip is ideally manufactured. FIG. 10 is a view of the LED chip illustrated in FIG. 7 when viewed from another angle.

Referring to FIG. 10, when the LED chip 210 is ideally manufactured, the growth substrate 215 of the LED chip 210 has a substantially rectangular parallelepiped shape. For example, both side surfaces of the growth substrate 215 of the LED chip 210 may be perpendicular to the upper surface of one of the n-type semiconductor layer 212, the p-type semiconductor layer 213, the light emitting layer 214, and the substrate 112. Both side surfaces of the growth substrate 215 correspond to surfaces on the left and right sides of the growth substrate 215 with reference to FIG. 10. Both side surfaces of the growth substrate illustrated in FIG. 10 may correspond to the front and rear surfaces of the growth substrate illustrated in FIG. 7.

As illustrated in FIG. 10, when the growth substrate 215 is ideally manufactured, both side surfaces of the growth substrate 215 may be provided vertically (i.e., substantially perpendicular to an upper surface of the light emitting layer 214). In this case, a center C1' of the light emitting layer 214 may coincide with a center C2' of the growth substrate 215 (refer to FIG. 11). In the state in which the growth substrate 215 is ideally manufactured, when the LED chip 210 is viewed with respect to B-B' of FIG. 5 unlike that illustrated in FIG. 7, the center C1' of the light emitting layer 214 may coincide with the center C2' of the upper surface of the growth substrate 215.

As illustrated in FIG. 10, when the center C1' of the light emitting layer 214 and the center C2' of the growth substrate 215 coincide with each other, a critical angle, at which optical paths of light emitted from one point of the light emitting layer 214 become different, is maximized. When the growth substrate 215 is ideally manufactured, the critical angle is maximized, and the critical angle becomes α1'. The critical angle, at which the optical paths become different, may be an angle at which light emitted from the center C1' of the light emitting layer 214 is emitted obliquely with respect to the normal passing through the center C1', and the critical angle corresponds to the minimum angle at which the optical paths become different. When the center C1' of the light emitting layer 214 and the center C2' of the upper surface of the growth substrate 215 coincide with each other, the critical angle, at which the optical paths become different, is maximized. In this case, the amount of emitted light in which the optical paths become different, may be minimized, and the light uniformity of the LED chip 210 may be improved. Further, the luminance of the display apparatus may be uniform.

Figure 11:
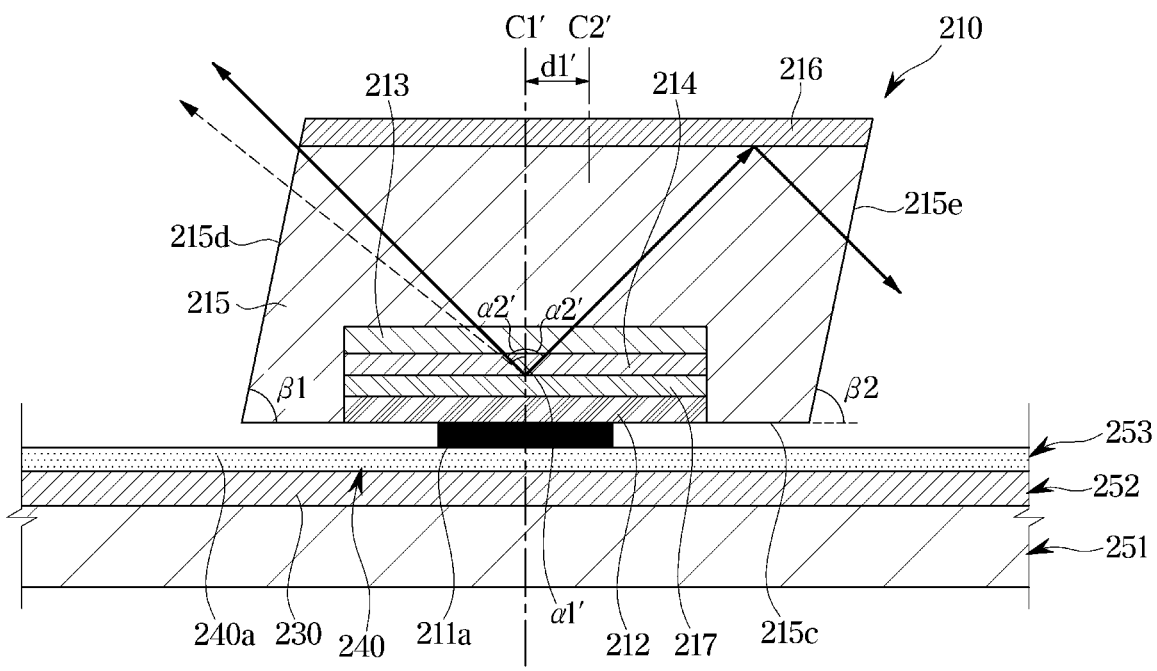
FIG. 11 is a view illustrating an actual state of the LED chip illustrated in FIG. 10.

FIG. 11 is a view illustrating an actual state of the LED chip illustrated in FIG. 10.

Hereinafter, an actual structure of the LED chip when designed as illustrated in FIG. 10 will be described in detail with reference to FIG. 11.

As illustrated in FIG. 11, in the case of the actual LED chip 210, both side surfaces of the growth substrate 215 may be inclined. Particularly, both side surfaces of the growth substrate 215 of the LED chip 210 may be provided inclined with respect to the upper surface of one of the n-type semiconductor layer 212, the p-type semiconductor layer 213, the light emitting layer 214 and the substrate 112.

According to an embodiment, the growth substrate 215 may be a sapphire substrate. When the growth substrate 215 is a sapphire substrate, a shape of both side surfaces of the growth substrate 215 is determined according to the grain of the sapphire. For example, an angle, at which both side surfaces are inclined with respect to the lower surface, is determined based on the grain of the sapphire.

As illustrated in FIG. 11, both side surfaces of the growth substrate 215 are not perpendicular to the lower surface of the growth substrate 215 due to the physical properties of sapphire. The side surface of the growth substrate 215 may be inclined by a predetermined angle with respect to the lower surface of the growth substrate 215. The predetermined angle may be $\beta 1$ or $\beta 2$, and $\beta 1$ and $\beta 2$ may be the same angle. According to an embodiment, $\beta 1$ and $\beta 2$ may be 83° to 85°. Because the growth substrate 215 illustrated in FIGS. 8 and 9 and the growth substrate 215 illustrated in FIG. 11 are formed of the same material, an angle at which both side surfaces of the growth substrate 215 are inclined with respect to the lower surface of the growth substrate 215, may be provided the same as $\beta 1$ and $\beta 2$.

When the growth substrate 215 is a sapphire substrate, both side surfaces of the growth substrate 215 may not be perpendicular to the lower surface, but both side surfaces may be provided to be inclined with respect to the lower surface according to the grain of the sapphire substrate, and the angle may be approximately 83° to 85°. However, it is not limited to the above angle, and may have an angle of greater than or equal to 85°, but not greater than or equal to 90° as designed.

Referring to FIG. 11, both side surfaces of the growth substrate 215 are provided to be inclined with respect to the lower surface, respectively, due to the physical properties of the sapphire substrate, and thus the center C1' of the light emitting layer 214 and the center C2' of the upper surface of the growth substrate 215 are spaced apart laterally. Hereinafter, the center C2' of the upper surface of the growth substrate 215 may correspond to the center of the first DBR layer 216.

Hereinafter, a distance between the center C1' of the light emitting layer 214 and the center C2' of the upper surface of the actual growth substrate 215 is referred to as d1'. When both side surfaces of the growth substrate 215 are inclined due to the physical properties of sapphire, the distance between the center C1' of the light emitting layer 214 and the center C2' of the upper surface of the growth substrate 215 may increase, and thus the light uniformity of the LED chip 210 may be reduced, and the luminance of the display apparatus may be non-uniform.

When the distance between the center C1' of the light emitting layer 214 and the center C2' of the upper surface of the growth substrate 215 is reduced, the critical angle, at which the optical paths of light emitted from one point of the light emitting layer 214 become different, is also reduced. As described above, when the distance between the center C1' of the light emitting layer 214 and the center C2' of the upper surface of the growth substrate 215 is zero, the critical angle may be the maximum as $\alpha 1'$, and in response to the distance of d1', the critical angle may be $\alpha 2'$ less than $\alpha 1'$. In response to the distance between the centers being increased from 0 to d1', the critical angle, at which the optical paths become different, may be reduced from $\alpha 1'$ to $\alpha 2'$. Accordingly, the amount of emitted light in which the optical paths become different may be increased, and the light uniformity of the LED chip 210 may be further reduced. Accordingly, there is a need to reduce the distance d1' between the center C1' of the light emitting layer 214 and the center C2' of the upper surface of the growth substrate 215.

Figure 12:
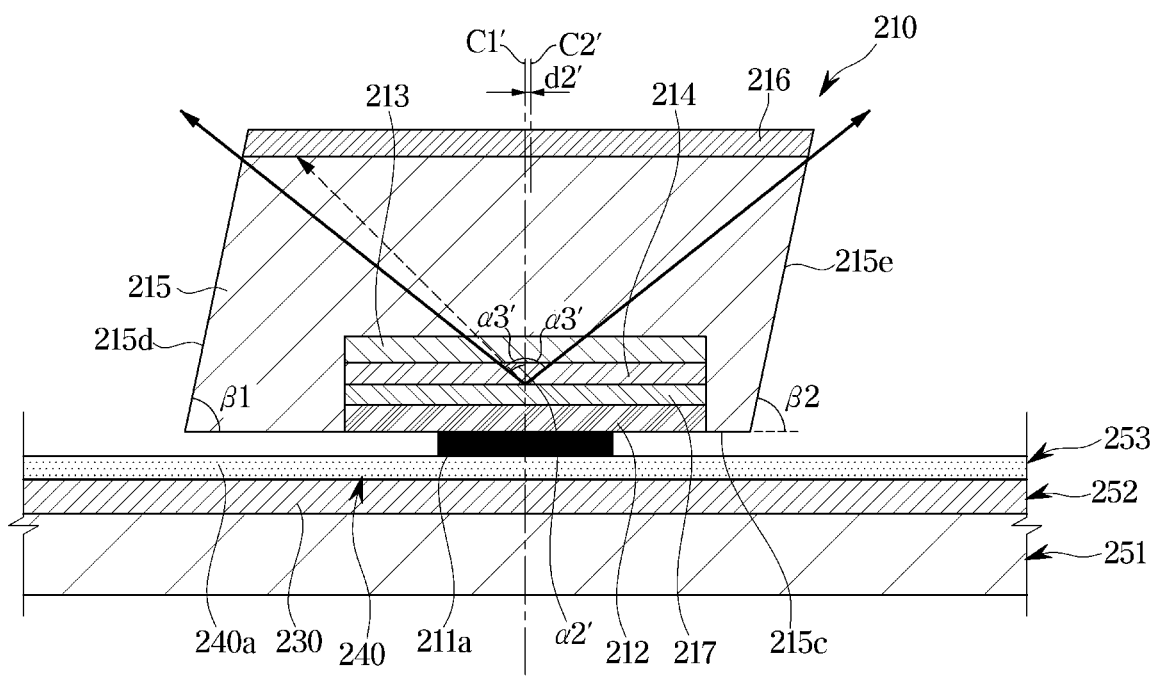
FIG. 12 is a cross-sectional view taken along line B-B' of FIG. 5, illustrating the LED chip according to an embodiment.

FIG. 12 is a cross-sectional view taken along line B-B' of FIG. 5, illustrating an LED chip according to an embodiment.

Hereinafter, a structure of the LED chip according to an embodiment will be described in detail.

As illustrated in FIG. 12, both side surfaces of the growth substrate 215 may be inclined, like the actual structure illustrated in FIG. 11. Hereinafter, in the LED chip 210 according to an embodiment, the center of the growth substrate 215 is referred to as C2'. In addition, a distance between the center C1' of the light emitting layer 214 and the center C2' of the upper surface of the growth substrate 215 is referred to as d2'.

According to the disclosure, d2'<d1' is satisfied. This is because the center of the light emitting layer 214 is shifted laterally to allow the distance between the center C1' of the light emitting layer 214 and the center C2' of the growth substrate 215 to be reduced. At this time, the side is defined based on FIG. 12.

The light emitting layer 214 may be shifted toward one side of the growth substrate 215 in a direction in which the center C2' of the growth substrate 215 is close to the center C1' of the light emitting layer 214. The direction in which the center C2' of the upper surface of the growth substrate 215 is close to the center C1' of the light emitting layer 214 may be a direction in which the light emitting layer 214 is close to one side surface 215e, in which an included angle with a lower surface 215c of the growth substrate 215 is an obtuse angle, among both side surfaces 215d and 215e of the growth substrate 215. With respect to FIG. 12, the light emitting layer 214 may be shifted to be closer to one side surface 215e of the growth substrate 215 that to the other side surface 215d of the growth substrate 215. In this case, the included angle between the one side surface 215e of the growth substrate 215 and the lower surface 215c of the growth substrate 215 is an obtuse angle. This is because $\beta 2$ is an acute angle, as described above.

As described above, by shifting the light emitting layer 214, d2'<d1' may be satisfied. Thus, the center C1' of the light emitting layer 214 and the center C2' of the upper surface of the growth substrate 215 coincide with each other and d2'=0.

As illustrated in FIG. 12, when the distance d2' between the center C1' of the light emitting layer 214 and the center C2' of the upper surface of the growth substrate 215 is reduced, the critical angle, at which the optical paths of light emitted from one point of the light emitting layer 214 become different, is increased. The critical angle, at which the optical paths become different, is an angle at which light emitted from the center C1' of the light emitting layer 214 is emitted obliquely with respect to the normal passing through the center C1', and corresponds to the minimum angle at which the optical paths become different. When the distance between the center C1' of the light emitting layer 214 and the center C2' of the upper surface of the growth substrate 215 is reduced from d1' to d2', the critical angle at which the optical paths become different may be increased from α2' to α3'. Accordingly, an amount of emitted light in which the optical paths become different may be reduced, and the light uniformity of the LED chip 210 may be improved. Further, the luminance of the display apparatus may be uniform.

According to the disclosure, by shifting the light emitting layer 214, the distance between the center C1' of the light emitting layer 214 and the center C2' of the upper surface of the growth substrate 215 may be reduced, and thus the critical angle may be increased. By shifting the light emitting layer 214, the critical angle may be closer to the maximum critical angle when viewed in the cross section taken along line B-B' in FIG. 5. Further, when d2'=0, the critical angle may be the maximum. Hereinafter, a method for shifting the light emitting layer 214 to one side of the growth substrate 215 will be described.

The LED chip 210 may be manufactured in such a way that a plurality of n-type semiconductor layers 212, a plurality of p-type semiconductor layers 213, a plurality of light emitting layers 214, and a plurality of electrodes 211a and 211b are stacked on one surface of the growth substrate 215 and the first DBR layer 216 is formed on the other surface of the growth substrate 215, and then the growth substrate 215 is cut into a plurality of pieces.

When cutting the growth substrate 215, a cutting line is determined in advance, and the growth substrate is cut along the cutting line. In this case, by shifting the cutting line by a predetermined distance, the light emitting layer 214 may be shifted to one side of the growth substrate 215.

As is apparent from the above description, it is possible to provide a light emitting diode (LED) chip having improved light uniformity by improving a structure and a display apparatus including the same.

Further, it is possible to provide an LED chip in which a center of a light emitting layer coincides with a center of a distributed Bragg reflector (DBR) layer arranged on an upper surface of a substrate, by shifting the light emitting layer to one side of the substrate, and a display apparatus including the same.

Further, it is possible to provide an LED chip in which a center of a light emitting layer coincides with a center of a DBR layer arranged on an upper surface of a substrate by shifting a cutting line of the substrate during the manufacturing of the LED chip, and a display apparatus including the same.

Although a few embodiments have been shown and described, it would be appreciated by those skilled in the art that changes may be made in these embodiments without departing from the principles and spirit of the disclosure, the scope of which is defined in the claims and their equivalents.

What is claimed is:

1. A display apparatus comprising:
a display panel; and
a light emitting diode (LED) chip configured to emit light to the display panel,
wherein the LED chip comprises:
a light emitting layer configured to emit light;
a semiconductor layer provided on the light emitting layer; and
a growth substrate provided on the semiconductor layer,
wherein the light emitting layer is arranged to be biased toward a first side of the growth substrate such that a center of an upper surface of the growth substrate is provided between a center of the light emitting layer and a center of the semiconductor layer.

2. The display apparatus of claim 1, wherein the LED chip further comprises a distributed Bragg reflector (DBR) layer provided on an upper surface of the growth substrate.

3. The display apparatus of claim 1, wherein the growth substrate comprises a sapphire substrate.

4. The display apparatus of claim 1, further comprising a printed circuit board,
wherein the LED chip is provided on a mounting surface of the printed circuit board.

5. The display apparatus of claim 4, wherein the LED chip is mounted on the mounting surface by a Chip On Board (COB) method.

6. The display apparatus of claim 1, wherein
a length of a horizontal side of the LED chip and a length of a vertical side of the LED chip is 500 μm or less, respectively.

7. The display apparatus of claim 1, wherein the semiconductor layer is an n-type semiconductor layer,
wherein the LED chip further comprises a p-type semiconductor layer, and
wherein the light emitting layer is provided between the n-type semiconductor layer and the p-type semiconductor layer.

8. The display apparatus of claim 1, wherein the LED chip further comprises a first distributed Bragg reflector layer (DBR) layer provided on an upper surface of the growth substrate, and a second DBR layer arranged on a lower surface of the light emitting layer.

9. The display apparatus of claim 1, wherein the LED chip is configured to emit blue light.

10. The display apparatus of claim 1, wherein the growth substrate comprises a first side surface and a second side surface that is substantially parallel to the first side surface,
wherein a first angle between the first side surface and the lower surface of the growth substrate is an acute angle,
wherein a second angle between the second side surface and the lower surface of the growth substrate is an obtuse angle, and
wherein the light emitting layer is shifted in a direction closer to the second side surface.

11. The display apparatus of claim 10, wherein the first angle and the second angle are determined by the physical properties of the growth substrate.

12. The display apparatus of claim 1, wherein the center of the upper surface of the growth substrate and the center of the light emitting layer are positioned on a straight line perpendicular to the upper surface of the growth substrate and the light emitting layer.

13. The display apparatus of claim 12, wherein the light emitting layer is shifted to the first side of the growth substrate by shifting a cutting line that determines the first side surface.

14. The display apparatus of claim 1, further comprising: an optical dome provided on the LED chip.

15. The display apparatus of claim 14, wherein the optical dome comprises silicone or epoxy resin.

16. A light emitting diode (LED) chip comprising:
a light emitting layer configured to emit light;
a semiconductor layer provided on the light emitting layer; and
a growth substrate provided on the semiconductor layer,
wherein the light emitting layer is arranged to be biased toward a first side of the growth substrate such that a center of an upper surface of the growth substrate is provided between a center of the light emitting layer and a center of the semiconductor layer.

17. A light emitting diode (LED) chip comprising:
a light emitting layer;
a first semiconductor layer provided on the light emitting layer; and
a growth substrate provided on the first semiconductor layer, the growth substrate comprising a first sidewall, and a second sidewall that is substantially parallel to the first sidewall and oblique to an upper surface of the growth substrate,
wherein a center of the light emitting layer is closer to the second sidewall than the first sidewall.

18. The LED chip of claim 17, wherein the growth substrate further comprises a third sidewall, and a fourth sidewall that is substantially parallel to the third sidewall and oblique to the upper surface of the growth substrate, and
wherein the center of the light emitting layer is closer to the fourth sidewall than the third sidewall.

19. The LED chip of claim 18, further comprising a reflector layer provided on the upper surface of the growth substrate, and
wherein the center of the light emitting layer and a center of the reflector layer are aligned with each other provided along a direction perpendicular to the upper surface of the growth substrate.

20. The LED chip of claim 19, wherein a first angle between the upper surface of the growth substrate and the first sidewall is substantially similar to a third angle between the upper surface of the growth substrate and the third sidewall, and
wherein a second angle between the upper surface of the growth substrate and the second sidewall is substantially similar to a fourth angle between the upper surface of the growth substrate and the fourth sidewall.

21. The LED chip of claim 20, wherein a sum of the first angle and the second angle corresponds to 180 degrees.

22. A display comprising:
a liquid crystal panel; and
a backlight, the backlight comprising a plurality of light emitting diode (LED) chips, each of which comprises:
a light emitting layer;
a first semiconductor layer provided on the light emitting layer; and
a growth substrate provided on the first semiconductor layer, the growth substrate comprising a first sidewall, and a second sidewall that is substantially parallel to the first sidewall and oblique to an upper surface of the growth substrate,
wherein a center of the light emitting layer is closer to the second sidewall than the first sidewall.

* * * * *